(12) United States Patent
Kim

(10) Patent No.: US 8,896,059 B1
(45) Date of Patent: Nov. 25, 2014

(54) SEMICONDUCTOR DEVICE INCLUDING MULTI-LAYERED GATE, ELECTRONIC DEVICE INCLUDING THE SAME, AND METHOD FOR FORMING THE SAME

(71) Applicant: SK Hynix Inc., Icheon (KR)

(72) Inventor: Seung Hwan Kim, Seoul (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/141,063

(22) Filed: Dec. 26, 2013

(30) Foreign Application Priority Data

Jul. 24, 2013 (KR) ........................ 10-2013-0087138

(51) Int. Cl.
*H01L 29/78* (2006.01)
*H01L 27/115* (2006.01)

(52) U.S. Cl.
CPC .......... *H01L 27/115* (2013.01); *H01L 29/7827* (2013.01)

USPC .......................................................... 257/331

(58) Field of Classification Search
CPC ................... H01L 27/10876; H01L 27/10891; H01L 29/785; H01L 29/78; H01L 29/4236
USPC .......................................................... 257/331
See application file for complete search history.

(56) References Cited

U.S. PATENT DOCUMENTS

2011/0260242 A1* 10/2011 Jang ............................. 257/331

FOREIGN PATENT DOCUMENTS

| KR | 10-2009-0081615 A | 7/2009 |
| KR | 10-2005-0115822 A | 8/2012 |
| KR | 10-1194973 B1 | 10/2012 |

* cited by examiner

*Primary Examiner* — Zandra Smith
*Assistant Examiner* — Paul Patton

(57) ABSTRACT

A semiconductor device including a multi-layered gate, is formed as a stacked structure of a plurality of layers having different work functions.

16 Claims, 14 Drawing Sheets

US 8,896,059 B1

SEMICONDUCTOR DEVICE INCLUDING MULTI-LAYERED GATE, ELECTRONIC DEVICE INCLUDING THE SAME, AND METHOD FOR FORMING THE SAME

CROSS-REFERENCE TO RELATED APPLICATION

The priority of Korean patent application No. 10-2013-0087138 filed on 24 Jul. 2013, the disclosure of which is hereby incorporated by reference in its entirety, is claimed.

BACKGROUND

Embodiments of the present invention relate to a semiconductor device, and more particularly, to a semiconductor device in which a plurality (e.g., three) layers of materials having different work functions are stacked.

Semiconductor devices are designed for predetermined purposes by implanting impurities or depositing new materials at predetermined regions in a silicon wafer. Semiconductor memory devices include a number of elements to carry out given purposes, for example, transistors, capacitors, resistors, and the like. Individual elements are interconnected through a conductive layer so that data or signals are communicated therebetween.

As technologies for manufacturing semiconductor devices develop, intensive research has been conducted on methods for forming more chips on a single wafer by increasing the integration degree of semiconductor devices. In order to increase the integration degree of semiconductor devices, the minimum feature size required for the design rules of the devices becomes smaller.

For example, the distance between a bit line and a gate is gradually reduced in proportion to the increasing degree of integration. However, as a result, parasitic capacitance between the bit line and the gate is also increased. In order to obviate the above problem, a buried gate structure in which a gate is buried in a semiconductor substrate has recently been proposed and developed.

SUMMARY

Embodiments of the present invention are directed to a semiconductor device including a multi-layered gate, an electronic device including the semiconductor device, and a method for forming the semiconductor device.

Embodiments relate to a semiconductor device that can reduce a Gate Induced Drain Leakage (GIDL) and increase a threshold voltage of a transistor.

In accordance with an aspect of an embodiment, a semiconductor device including a multi-layered gate includes: a gate insulation film; and a gate formed over the gate insulation film, wherein the gate includes: a threshold-voltage increase layer formed over the gate insulation film to have a first work function; a resistance-reduction layer formed over the gate insulation film to have a second work function lower than the first work function; and a leakage prevention layer formed over the gate insulation film to have a third work function lower than the second work function.

In accordance with another aspect of an embodiment, a semiconductor device including a multi-layered gate includes: a gate insulation film; and a gate formed over the gate insulation film, wherein the gate includes: a P$^+$ polysilicon layer formed over the gate insulation film; a cobalt silicide (CoSi$_2$) layer formed not only over the P$^+$ polysilicon layer but also over the gate insulation film; and an N$^+$ polysilicon layer formed not only over the cobalt silicide (CoSi$_2$) layer but also over the gate insulation film.

In accordance with another aspect of an embodiment, a method for forming a semiconductor device includes: forming a device isolation film configured to define an active region; forming a trench by etching the active region; forming a first conductive layer to be buried in the trench; forming a second conductive layer by converting an upper portion of the first conductive layer into a silicide layer; forming a third conductive layer over the second conductive layer; and forming a sealing film over the third conductive layer so as to fill the trench.

In accordance with another aspect of an embodiment, an electronic device includes: a memory device configured to store data and read the stored data in response to a data input/output (I/O) control signal; and a memory controller configured to generate the data I/O control signal, and control data I/O operations of the memory device, wherein the memory device includes: a gate insulation film; and a gate formed over the gate insulation film, wherein the gate includes: a threshold-voltage increase layer formed over the gate insulation film to have a first work function; a resistance-reduction layer formed over the gate insulation film to have a second work function lower than the first work function; and a leakage prevention layer formed over the gate insulation film to have a third work function lower than the second work function.

These and other features, aspects, and advantages of the present invention will become better understood with reference to the following description, accompanying drawings, and appended claims. It is noted that the invention is not limited to the specific embodiments described herein. Such embodiments are presented herein for illustrative purposes only. Additional embodiments will be apparent to persons skilled in the relevant art. It is to be understood that both the foregoing general description and the following detailed description of embodiments are intended to provide further explanation of the invention as claimed.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
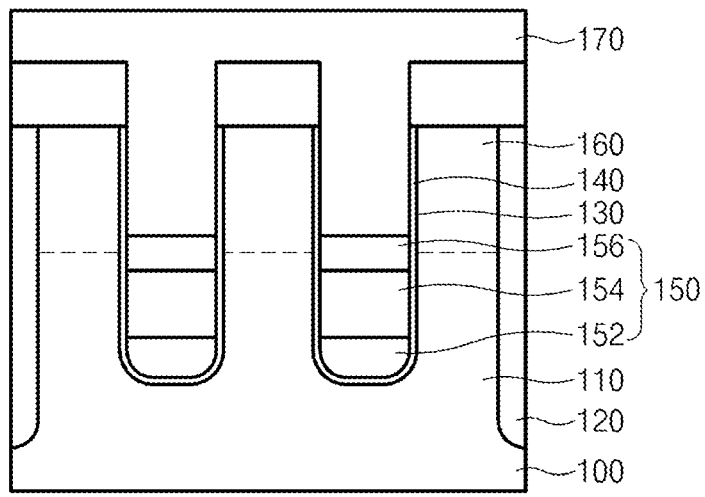
FIG. 1 is a cross-sectional view illustrating a gate structure of a semiconductor device according to an embodiment.

FIG. 1 is a cross-sectional view illustrating a gate structure of a semiconductor device according to an embodiment. FIG. 1 is a cross-sectional view illustrating the semiconductor device taken along a long axis of an active region in a cell region.

Referring to FIG. 1, an active region 110 defined by a device isolation film 120 is formed over a semiconductor substrate 100. A trench 130 of a predetermined depth is formed in the active region 110. Although not shown in the cross-section of FIG. 1, the trench 130 extends in a line across the device isolation film 120. A gate insulation film 140 is formed at an inner surface of the trench 130, and a gate 150 is buried in the trench 130 and is formed over the gate insulation film 140.

The gate 150 according to an embodiment includes a stacked structure of a plurality of layers (e.g., three layers) of materials having different work functions. As a result, GIDL may be reduced and a threshold voltage (Vt) of a transistor may be increased.

For example, the gate 150 includes a threshold-voltage increase layer 152, a resistance-reduction layer 154, and a leakage prevention layer 156. The threshold-voltage increase layer 152 is formed at the lowest level of the gate 150, i.e., at the bottom of the trench 130. The threshold-voltage increase layer 152 is formed of a specific material selected so that there is a large difference in work function between a channel region and the threshold-voltage increase layer 152, resulting in an increased threshold voltage (Vt) of a transistor. The resistance-reduction layer 154 is formed over the threshold-voltage increase layer 152, and obtains a resistance of the gate 150. The leakage prevention layer 156 is formed over the resistance-reduction layer 154 and vertically overlaps with a junction region 160. The leakage prevention layer 156 is formed of a specific material selected so that there is a small difference in work function between the junction region 160 and the material of the leakage prevention layer 156, resulting in reduced GIDL.

In an embodiment, the threshold-voltage increase layer 152 may include a material having a higher work function than that of the resistance-reduction layer 154. In an embodiment, the threshold-voltage increase layer 152 is a P$^+$ polysilicon layer. The resistance-reduction layer 154 may include a metal silicide. In an embodiment, the resistance-reduction layer 154 is a cobalt silicide (CoSi$_2$) layer. The leakage prevention layer 156 includes a material having a lower work function than that of the resistance-reduction layer 154. In an embodiment, the leakage prevention layer 156 is an N$^+$ polysilicon layer. In another embodiment, the threshold-voltage increase layer 152 is formed of a conductive layer (e.g., metal layer) having a higher work function than that of the resistance-reduction layer 154, and the leakage prevention layer 156 is formed of a conductive layer (e.g., metal layer) having a lower work function than that of the resistance-reduction layer 154.

The threshold-voltage increase layer 152, the resistance-reduction layer 154, and the leakage prevention layer 156 are stacked to form the gate 150. The gate 150 is formed to contact the gate insulation film 140. The leakage prevention layer 156 is arranged to partially overlap with the junction region (i.e., the storage node junction region) 160 along a vertical axis. The threshold-voltage increase layer 152 and the resistance-reduction layer 154 are provided below the junction region 160 so that they do not overlap with the junction region 160 along a vertical axis. The same gate voltage may be applied to the threshold-voltage increase layer 152, the resistance-reduction layer 154, and the leakage prevention layer 156.

In an embodiment, a specific region of the semiconductor device including the gate 150 is formed in a fin structure in which the active region 110 is more protruded than the device isolation film 120. The threshold-voltage increase layer 152 encloses the bottom and lower lateral surfaces of the active region 110 exposed by the trench 130.

A sealing film 170 for sealing the trench 130 is formed over the gate 150 to insulate the gate 150.

FIGS. 2a to 2f are cross-sectional views illustrating a method for forming a gate structure according to an embodiment. FIGS. 3a and 3b are plan views illustrating embodiments of the present invention. Hereinafter, methods in accordance with an embodiment of the present invention will be described with reference to FIGS. 2a to 2f and FIGS. 3a and 3b.

Figure 2A:
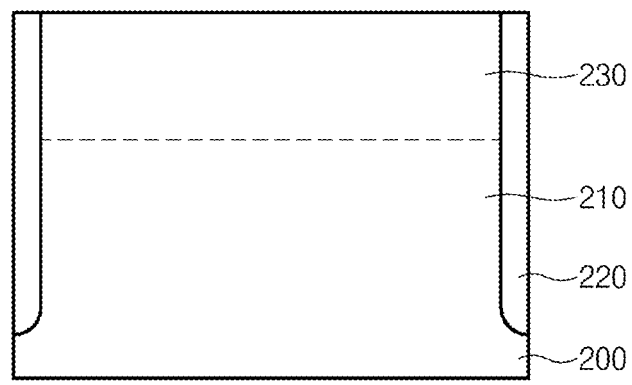
FIGS. 2a to 2f are cross-sectional views illustrating a method for forming the gate structure shown in FIG. 1.
Figure 3A:
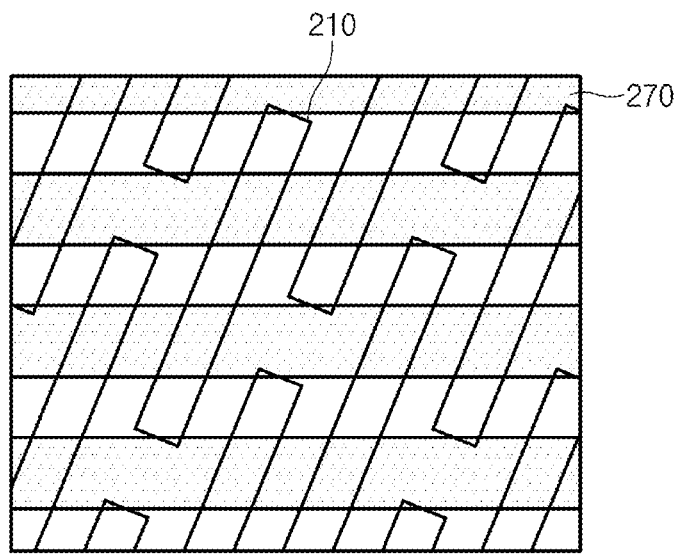
FIGS. 3a and 3b illustrate shapes of active regions for use in a semiconductor device according to an embodiment.
Figure 3B:
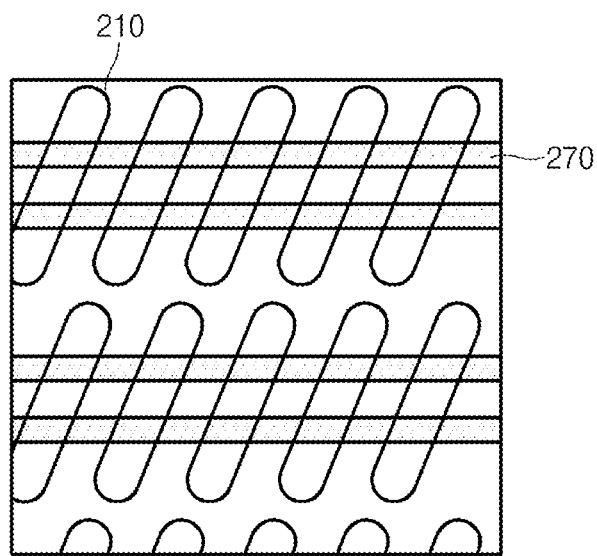

Referring to FIG. 2a, a pad oxide film (not shown) and a pad nitride film (not shown) are formed over a semiconductor substrate 200 including a P-well, and a hard mask pattern (not shown) for defining the active region 210 is formed over the pad nitride film. In an embodiment, the hard mask pattern is formed as a line-type pattern through a Space Pattern Technology (SPT) process. The hard mask pattern is etched and isolated by a cut mask to have a predetermined length (i.e., the length of an active region), such that the active region is defined. In an embodiment, the active region 210 is defined to obliquely cross a bitline and gate (word line) to be formed in a subsequent process.

Referring to FIG. 3a, in an embodiment, the active regions 210 are arranged to form a zigzag pattern so that a gate 270 alternately crosses an active region 210 and passes between two adjacent active regions 210, as shown in FIG. 3a. For example, viewing FIG. 3a from left to right, a gate 270 may extend across an active region 210, and then pass between two active regions 210 before crossing another active region 210.

Referring to FIG. 3b, in another embodiment, the active regions 210 may be arranged in parallel to one another in a row that progresses along the same direction that the gate 270 extends in, as shown in FIG. 3b. For example, as shown in FIG. 3b, active regions 210 are arranged in parallel in rows so that a gate 270 extends across the active regions 210 in the row, but does not pass between adjacent rows of active regions 270.

Referring again to FIG. 2a, the pad nitride film, the pad oxide film, and the semiconductor substrate 200 are sequentially etched using the hard mask pattern as an etch mask, such that a device-isolation trench (not shown) defining the active region 210 is formed. Here, the etch process may be a dry etching process.

Subsequently, a sidewall insulation film (not shown) is formed at a sidewall of the device-isolation trench. The sidewall insulation film may include a wall oxide material. In an embodiment, the wall oxide material may be deposited at a sidewall of the trench. In an embodiment, the sidewall insulation film is formed on a sidewall of the trench through a dry or wet oxidation process.

A device-isolation insulation film is formed to bury the device-isolation trench. The device-isolation insulation film is etched and planarized to form a device isolation film 220 defining the active region 210. The etching and planarizing of the device-isolation insulation film stops before the pad nitride film is exposed. In an embodiment, the device isolation film 220 may include a Spin On Dielectric (SOD) material having superior gap-filling characteristics, or a High Density Plasma (HDP) oxide film.

Subsequently, the pad oxide film and the pad nitride film are removed. After the pad oxide film and the pad nitride film are removed, N-type impurities are implanted into the active region to form a junction region 230.

Figure 2B:
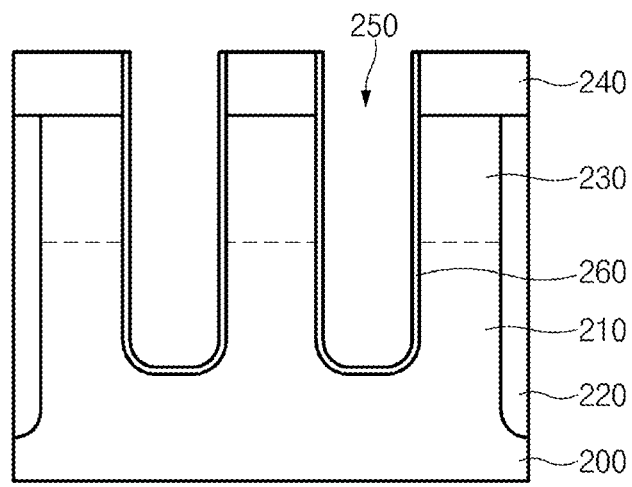

Referring to FIG. 2b, a pad insulation film is formed over the active region 210 and the device isolation film 220, and a photoresist pattern (not shown) defining a gate region is formed over the pad insulation film. The pad insulation film is etched using the photoresist pattern as an etch mask to form a pad insulation film pattern 240. The active region 210 and the device isolation film 220 are etched using the pad insulation film pattern 240 as an etch mask, such that a trench 250 for forming a buried gate (word line) is formed.

In an embodiment, since the gate is formed as a line-type gate, the active region 210 and the device isolation film 220 are simultaneously etched so that a trench 250 that extends along a line is formed. In an embodiment, the device isolation film 220 is more deeply etched than the active region 210 using an etch selectivity, such that a fin structure including the gate is formed in which the active region 210 is more protruded than the device isolation film 220. In an embodiment where the active regions 210 are arranged as shown in FIG. 3b, the trench 250 for the gate is not formed in the device isolation film 220 between storage node junction regions 230 of active regions 210 in different rows. For example, the trench 250 for the gate is not formed in the device isolation film 220 between active regions 210 that are adjacent to each other in a long-axis direction of the active regions.

Subsequently, a gate insulation film 260 is formed over a bottom surface and sidewalls of the active region 210 exposed by the trench 250. The gate insulation film 260 may include an oxide film, and may be formed through a deposition or thermal annealing process.

Figure 2C:
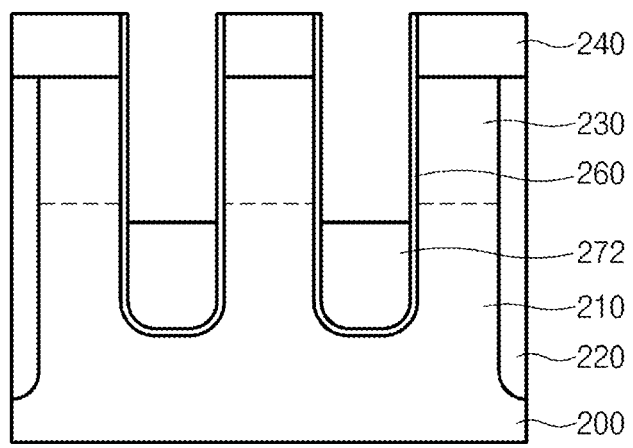

Referring to FIG. 2c, a conductive layer (not shown) for the gate is formed to bury the trench 250. In an embodiment, the conductive layer for the gate may include a polysilicon layer doped with $P^+$ impurities.

Subsequently, the conductive layer is etched back until a conductive material remains only at a lower part of the trench 250, resulting in formation of a first gate layer 272.

Figure 2D:
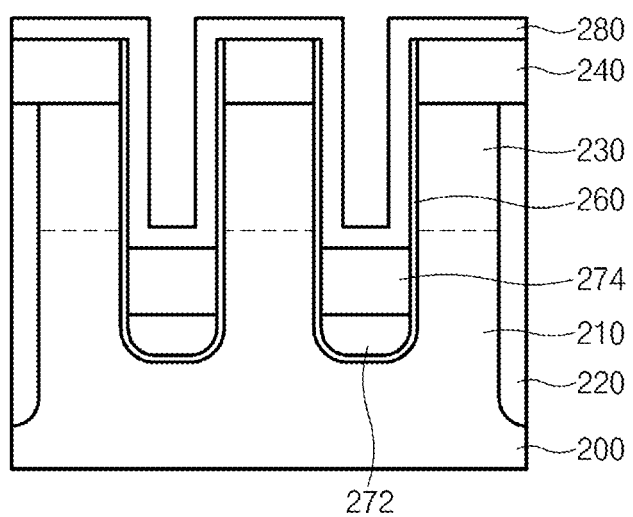

Referring to FIG. 2d, a metal layer 280 is deposited over a structure of FIG. 2c including the first gate layer 272. In an embodiment, the metal layer 280 includes a cobalt (Co) material. However, the metal layer 280 is not limited thereto. The metal layer 280 may include other rare-earth metals (tungsten (W), titanium(Ti), etc.) reacting with silicon (Si).

Subsequently, a primary thermal annealing (TA) process is applied to the metal layer 280. The primary thermal annealing (TA) process may include a Rapid Thermal Annealing (RTA) process under a nitrogen ($N_2$) gas atmosphere. Through the RTA process, the metal (e.g., cobalt) layer 280 reacts with first gate layer 272 (e.g., a polysilicon layer), so that some of the polysilicon first gate layer 272 is converted into a metal silicide layer (i.e., a cobalt silicide ($CoSi_2$) layer), resulting in formation of a second gate layer 274. Some of the metal layer 280 may not react with the first gate layer 272 and may remain over the second gate layer 274.

Figure 2E:
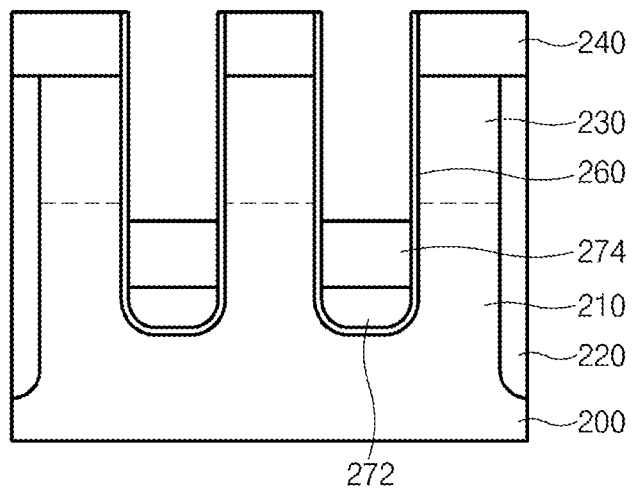

Referring to FIG. 2e, the remaining metal layer 280 is removed. In an embodiment, the remaining metal layer 280 is removed by a wet etching process. After the remaining metal layer 280 is removed, a secondary thermal annealing (TA) process is applied to the resultant structure. The secondary thermal annealing (TA) process may include a Rapid Thermal Annealing (RTA) process under the nitrogen ($N_2$) gas atmosphere.

Figure 2F:
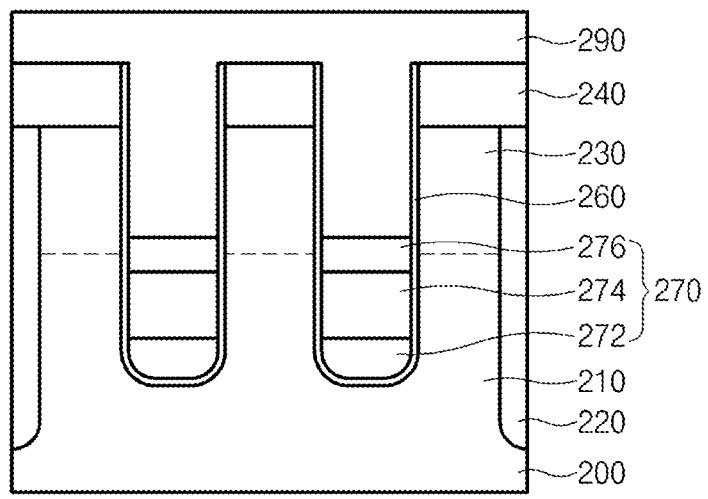

Referring to FIG. 2f, a conductive layer (not shown) for the gate is formed over the second gate layer 274 such that the trench 250 is filled with the conductive layer. In an embodiment, the conductive layer formed over the second gate layer 274 is a polysilicon layer doped with $N^+$ impurities. The conductive layer for the gate is etched back to form a third gate layer 276 over the second gate layer 274. The first gate layer 272, the second gate layer 274, and the third gate layer 274 form a three-layer gate 270.

Thereafter, a sealing film 290 is formed over the gate 270 in such a manner that the trench 250 is filled with the sealing film 290 to insulate the gate 270. The resultant sealing film 290 is then planarized or CMP-processed.

Subsequent processes (for example, processes for forming a bitline contact, a bitline, and a storage node contact) may be carried out using known or conventional methods. As such, a detailed description thereof will herein be omitted for convenience of description.

Figure 4:
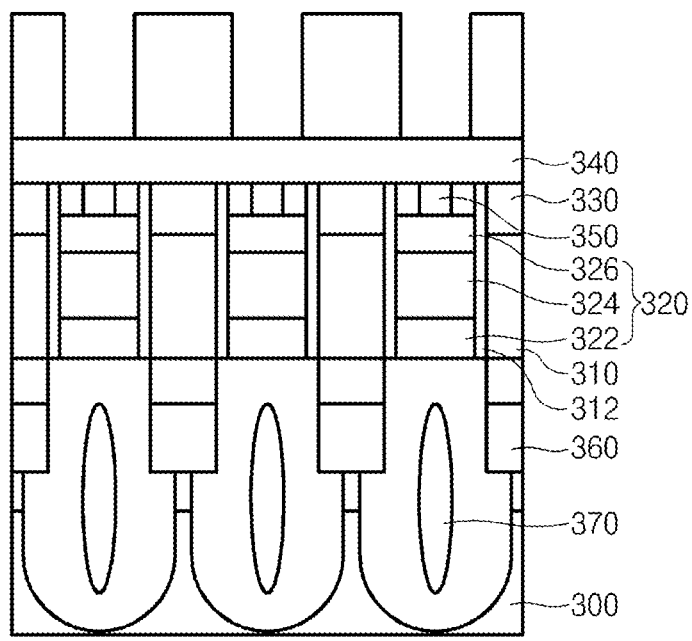
FIG. 4 is a cross-sectional view illustrating a semiconductor device according to another embodiment.

FIG. 4 is a cross-sectional view illustrating a semiconductor device according to another embodiment. FIG. 4 is a cross-sectional view illustrating a semiconductor device in which a gate structure in accordance with an embodiment of the present invention is applied to a vertical transistor.

Referring to FIG. 4, active pillars 310 vertically protrude from an etched semiconductor substrate 300 and are arranged at intervals of a predetermined distance. Gates 320 are arranged between pillars in a contiguous active region 310. In an embodiment, each gate 320 includes a three-layer structure in which three layers having different work functions are stacked to increase a threshold voltage (Vt) of the transistor and to reduce a GIDL.

For example, the gate 320 includes a threshold-voltage increase layer 322 formed as the lowermost layer in the gate 320 to increase the threshold voltage (Vt) of the transistor. A resistance-reduction layer 324 for acquiring a resistance of the gate is formed over the threshold-voltage increase layer 322. A leakage prevention layer 326 for reducing GIDL is formed over the resistance-reduction layer 324, vertically overlapping with a storage node junction region 330. The leakage prevention layer 326 is formed of a specific material so that there is a small difference in work function between the junction region 330 and the material of the leakage prevention layer 326.

In an embodiment, the threshold-voltage increase layer 322, the resistance-reduction layer 324, and the leakage prevention layer 326 may be in contact with the gate insulation film 312, which is formed over a sidewall of each active pillar 310. The threshold-voltage increase layer 322 may include a material (for example, $P^+$ polysilicon) having a higher work function than that of the resistance-reduction layer 324, and the resistance-reduction layer 324 may include a metal silicide layer. In an embodiment, a metal silicide layer is a $CoSi_2$ layer. The leakage prevention layer 326 may include a material (for example, $N^+$ polysilicon) having a lower work function than that of the resistance-reduction layer 324.

The gates 320 are arranged along the same direction that word line 340 extends. A gate contact 350 for coupling the gates 320 to the word line 340 is formed over each gate 320.

A line-type buried bitline 360 is formed below a channel region of the active pillars 310. In an embodiment, the buried bitline 360 is formed along a direction perpendicular to the direction in which the line-type word line 340 extends. An air-gap 370 is formed between the buried bitlines 360, so that coupling capacitance between bitlines is reduced.

Figure 5:
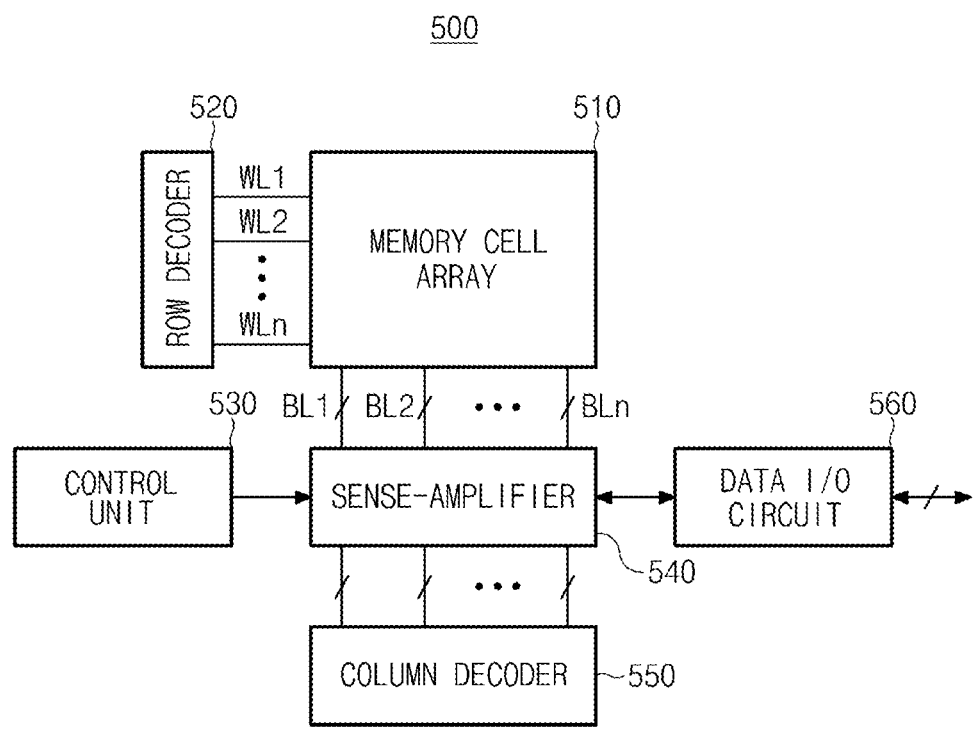
FIG. 5 is a block diagram illustrating a memory device according to an embodiment.

FIG. 5 is a block diagram illustrating a memory device according to an embodiment.

Referring to FIG. 5, the memory device 500 includes a memory cell array 510, a row decoder 520, a control circuit 530, a sense-amplifier (sense-amp) 540, a column decoder 550, and a data Input/Output (I/O) circuit 560.

The memory cell array 510 includes a plurality of word lines (WL1 to WLn) (where 'n' is a natural number), a plurality of bit lines (BL1 to BLn), and a plurality of memory cells (not shown) interconnected between the word lines (WL1 to WLn) and the bit lines (BL1 to BLn). Here, the memory cells (not shown) are arranged in the form of a matrix. Each memory cell includes a transistor serving as a switching element that is turned on or off in response to a voltage applied to the word lines (WL1 to WLn), and each transistor includes a gate (not shown) and a source/drain region (junction region) (not shown). The gate may be a buried gate in accordance with an embodiment of the present invention as shown in FIG. 1 or a vertical gate in accordance with an embodiment as shown in FIG. 4, or other gate structures. Specifically, the gate includes a stacked structure of a plurality of material layers having different work functions. As a result, a GIDL is reduced and a threshold voltage (Vt) of the transistor is increased.

For example, the gate may include a threshold-voltage increase layer, a resistance-reduction layer, and a leakage prevention layer. The threshold-voltage increase layer is formed at the lowermost level of the gate, and is formed of a specific material so that there is a large difference in work function between a channel region and the threshold-voltage increase layer, resulting in an increased threshold voltage (Vt) of a transistor. The resistance-reduction layer is formed over the threshold-voltage increase layer, and obtains a resistance of the gate. The leakage prevention layer is formed over the resistance-reduction layer, vertically overlapping with a junction region, and is formed of a specific material so that there is a small difference in work function between the junction region and the leakage prevention layer, resulting in reduced GIDL. In an embodiment, the threshold-voltage increase layer may include a P$^+$ polysilicon layer, and the resistance-reduction layer may include a metal silicide layer. The resistance-reduction layer may include a $CoSi_2$ layer. The leakage prevention layer may include an N$^+$ polysilicon layer.

The row decoder 520 generates a word line selection signal (row address) for selecting a memory cell in which data is to be read or written, and outputs the word line selection signal to the word lines (WL1 to WLn) so as to select a certain word line (WL1 to WLn).

A control circuit 530 controls the sense-amplifier 540 in response to a control signal (not shown) received from an external part.

The sense-amplifier 540 may sense/amplify data of each memory cell, and may store data in each memory cell. In an embodiment, the sense-amplifier 540 may include a plurality of sense-amplifiers (not shown) for sensing/amplifying data corresponding to a plurality of bit lines (BL1 to BLn), and each sense-amplifier may sense/amplify data of the plurality of bit lines (BL1 to BLn) in response to a control signal generated from the control circuit 530. The sense-amplifiers are respectively configured to sense/amplify data pieces of the bit lines (BL1 to BLn) in response to the control signal generated from the control circuit 530.

The column decoder 550 generates column selection signals for operating the sense-amplifiers coupled to cells selected by the row decoder 520, and outputs the column selection signals to the sense-amplifier 540.

The data Input/Output (I/O) circuit 560 may transmit write data received from an external part to the sense-amplifier 540 in response to a plurality of column selection signals generated from the column decoder 550, and may output read data sensed/amplified by the sense-amplifier 540 to the external part in response to the column selection signals generated from the column decoder 550.

The row decoder 520, the control circuit 530, the sense-amplifier 540, and the column decoder 550 from among the constituent elements of the above-mentioned memory device 500 may be substantially identical to those of a conventional memory device.

As described above, the above-mentioned three-layer gate is applied to a cell transistor of the memory device 500, such that a leakage current can be reduced and the operating current of the memory device can also be reduced. In addition, a threshold voltage of the cell transistor increases, and on/off characteristics of the cell transistor are improved, resulting in improved operation characteristics of the memory device 500.

Figure 6:
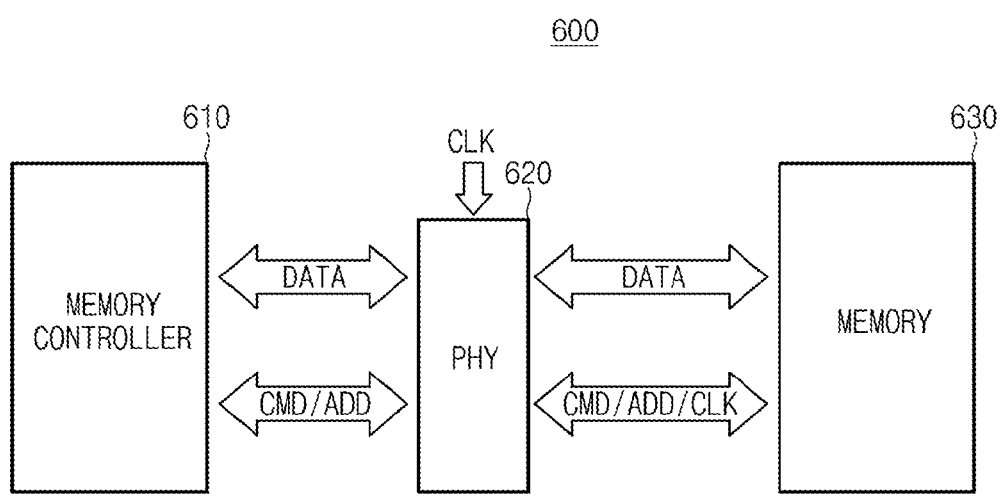
FIG. 6 is a block diagram illustrating an electronic device including a memory device according to an embodiment.

FIG. 6 is a block diagram illustrating an electronic device including a memory device according to an embodiment.

Referring to FIG. 6, the electronic device 600 may include a memory controller 610, a memory interface (PHY) 620, and a memory device 630.

The memory controller 610 generates data I/O control signals (command signal (CMD), address signal (ADD), etc.) for controlling the memory device 630, outputs the data I/O control signals to the memory device 630 through the memory interface 620, and thus controls data I/O operations (also called data Read/Write operations') of the memory device 630. The memory controller 610 may include a control unit for controlling a general data processing system to input/output data to/from the memory devices. The memory controller 610 may be embedded in a processor of electronic devices (for example, a Central Processing Unit (CPU), an Application Processor (AP), a Graphic Processing Unit (GPU), etc.), or may be configured in the form of a System on Chip (SoC) and be fabricated in one chip along with the processors. Although the memory controller 610 of FIG. 6 is denoted by one block, the memory controller 610 may include a controller of a volatile memory and a controller of a non-volatile memory.

The memory controller 610 may include a conventional controller for controlling a variety of memories. For example, the conventional controller may control Integrated Device Electronics (IDE), Serial Advanced Technology Attachment (SATA), Small Computer System Interface (SCSI), Redundant Array of Independent Disks (RAID), Solid State Disc (SSD), External SATA (eSATA), Personal Computer Memory Card International Association (PCMCIA), Multi Media Card (MMC), Embedded MMC (eMMC), Compact Flash (CF), Graphic Card, etc.

The memory interface 620 may provide a physical layer interface between the memory controller 610 and the memory device 630, and may process a timing point of data communicated between the memory controller 610 and the memory device 630 in response to a clock signal (CLK).

The memory device 630 may include a plurality of memory cells for storing data therein, store data (DATA) or read the stored data (DATA) upon receiving control signals (CMD, ADD) from the memory controller 610 through the memory interface 620, and then output the read data to the memory interface 620. In an embodiment, the memory device 630 may include the memory device 500 shown in FIG. 5. In other words, a gate contained in each memory cell of the memory device 630 includes a gate having a stacked structure of a plurality of layers having different work functions in accordance with an embodiment so as to reduce a GIDL as well as to increase a threshold voltage (Vt) of the transistor.

For example, the gate may include a threshold-voltage increase layer, a resistance-reduction layer, and a leakage prevention layer. The threshold-voltage increase layer is formed as the lowermost layer of the gate, and is formed of a specific material so that there is a large difference in work function between a channel region and the threshold-voltage increase layer. As a result, the threshold voltage (Vt) of a transistor is increased. The resistance-reduction layer is formed over the threshold-voltage increase layer, and obtains resistance of the gate. The leakage prevention layer is formed over the resistance-reduction layer, vertically overlapping with a junction region, and is formed of a specific material so that there is a small difference in work function between the junction region and the leakage prevention layer, resulting in improved GIDL.

In an embodiment, the threshold-voltage increase layer may include a $P^+$ polysilicon material, and the resistance-reduction layer may include a metal silicide material. The resistance-reduction layer may include a $CoSi_2$ material. The leakage prevention layer may include an $N^+$ polysilicon material.

The memory device 630 may include a non-volatile memory and a volatile memory. The volatile memory may include a Dynamic Random Access Memory (DRAM), a Mobile DRAM, a Static Random Access Memory (SRAM), etc. The non-volatile memory may include a Nor Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), etc. In addition, the memory device 630 shown in FIG. 6 is denoted by only one block, and may include a plurality of memory chips. If the memory device 630 is comprised of a plurality of memory chips, the memory chips may be stacked on a substrate (board) or may be mounted in a planar fashion onto the substrate (board).

A three-layer gate in accordance with an embodiment is applied to a cell transistor of the memory device 630 for use in the electronic device 600, such that the operation current of the memory device can be reduced and the operation characteristics of the memory device can be improved, resulting in improved operation characteristics of the electronic device.

Figure 7A:
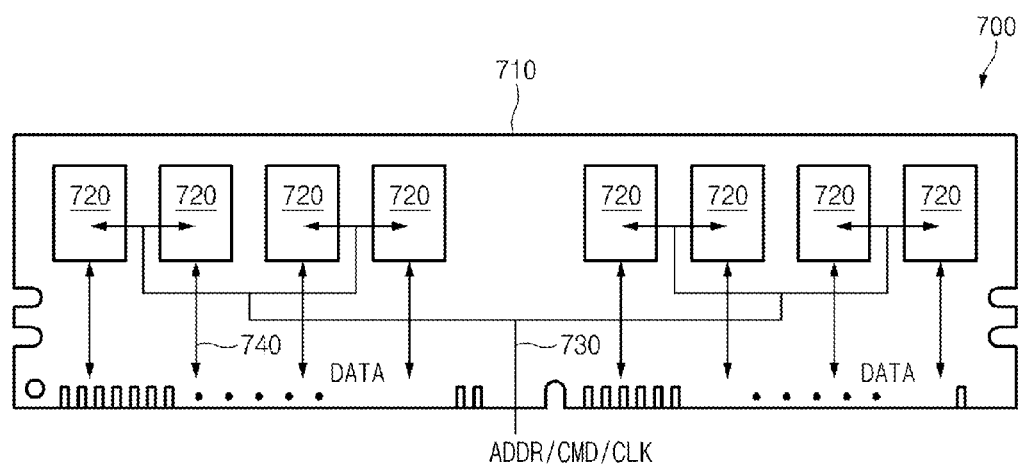
FIGS. 7a and 7b illustrate various examples of the memory device shown in FIG. 6.
Figure 7B:
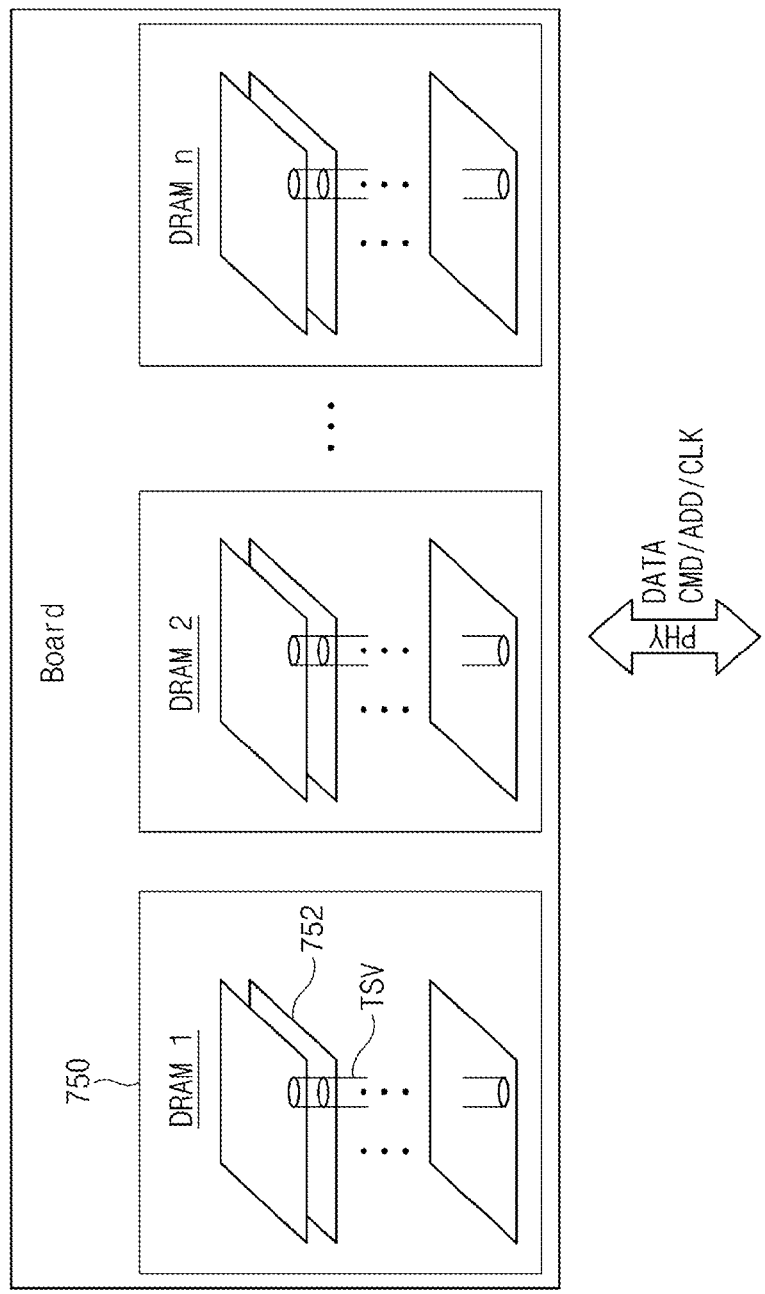

FIGS. 7a and 7b illustrate various examples of the memory device 630 shown in FIG. 6.

Referring to FIG. 7a, several memory chips 720 are mounted to a module substrate 710 in such a manner that the memory chips 720 can be inserted into memory slots of a computer.

The semiconductor module 700 includes a plurality of memory chips 720 mounted to a module substrate 710, a command link 730 for receiving signals (ADD, CMD, and CLK) controlling the memory chips 720, and a data link 740 for receiving I/O data of the memory chips 720.

Here, each memory chip 720 may include the memory device 500 shown in FIG. 5. The gate contained in each memory cell of the memory chip 720 includes a stacked structure of three layers having different work functions in accordance with an embodiment of the present invention. As a result, a GIDL is reduced and a threshold voltage (Vt) of a transistor is increased.

For example, the gate includes a threshold-voltage increase layer, a resistance-reduction layer, and a leakage prevention layer. The threshold-voltage increase layer is formed as the lowest layer of the gate, and is formed of a specific material so that there is a large difference in work function between a channel region and the threshold-voltage increase layer, resulting in an increased threshold voltage (Vt) of a transistor.

The resistance-reduction layer is formed over the threshold-voltage increase layer, and obtains resistance of the gate. The leakage prevention layer is formed over the resistance-reduction layer, vertically overlapping with a junction region, and is formed of a specific material so that there is a small difference in work function between the junction region and the leakage prevention layer, resulting in improved GIDL. In an embodiment, the threshold-voltage increase layer may include a $P^+$ polysilicon material. The resistance-reduction layer may include a metal silicide material. The resistance-reduction layer may include a cobalt silicide ($CoSi_2$) material. The leakage prevention layer may include an $N^+$ polysilicon material.

Although FIG. 7a shows that memory chips 720 are mounted at the front surface of the module substrate 710, it should be noted that the memory chips 720 can also be mounted to a back surface of the module substrate 710. In addition, the number of memory chips 720 mounted to the module substrate 710 is not limited to the number of memory chips 720 shown in FIG. 7a, and a material and structure of the module substrate 710 are not specially limited. One of skill in the art will understand that various modifications may be made without departing from the scope of an embodiment in accordance with the present invention.

FIG. 7b illustrates another example of the memory device shown in FIG. 6.

Referring to FIG. 7b, the memory device 750 may be implemented by stacking/packaging a plurality of semiconductor layers (semiconductor chips) 752, and at least one memory device 750 may be mounted to a board (substrate) and operate in response to a control signal of the memory controller 610. In an embodiment, the memory device 750 may include a specific structure in which the same semiconductor layers (chips) are interconnected through a through silicon via (TSV), or may include another structure in which heterogeneous semiconductor layers (chips) are interconnected through a TSV. Although FIG. 7b illustrates that signal transmission between semiconductor layers is achieved through a TSV for convenience of description, the scope or spirit of an embodiment is not limited thereto.

In an embodiment, the semiconductor layer 752 may include the memory device 500 shown in FIG. 5. That is, the gate contained in each memory cell of the semiconductor layer 752 includes a stacked structure of three layers having different work functions in accordance with an embodiment. As a result, a GIDL is reduced and a threshold voltage (Vt) of a transistor is increased.

For example, the gate includes a threshold-voltage increase layer, a resistance-reduction layer, and a leakage prevention layer. The threshold-voltage increase layer is formed as the lowest layer of the gate, and is formed of a specific material so that there is a large difference in work function between a channel region and the threshold-voltage layer, resulting in an increased threshold voltage (Vt) of a transistor. The resistance-reduction layer is formed over the threshold-voltage increase layer, and obtains resistance of the gate. The leakage prevention layer is formed over the resistance-reduction layer, vertically overlapping with a junction region, and is formed of a specific material so that there is a small difference in work function between the junction region and the leakage prevention layer, resulting in improved GIDL. In an embodiment, the threshold-voltage increase layer may include a $P^+$ polysilicon material. The resistance-reduction layer may include a metal silicide material. The resistance-reduction layer may include a cobalt silicide ($CoSi_2$) material. The leakage prevention layer may include an $N^+$ polysilicon material.

Figure 8:
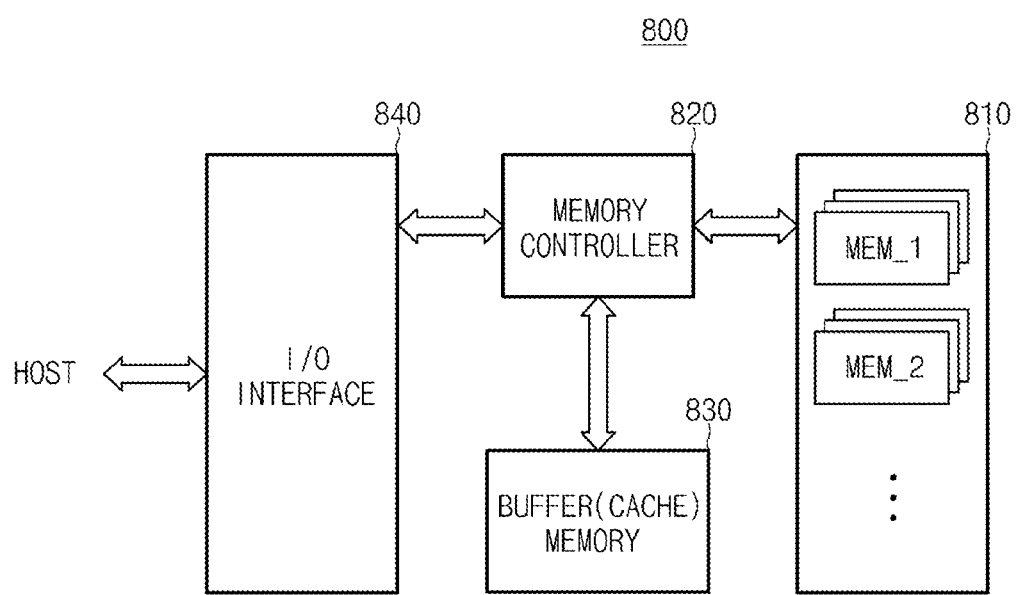
FIG. 8 is a block diagram illustrating a memory system according to another embodiment.

FIG. 8 is a block diagram illustrating an electronic device according to another embodiment.

Referring to FIG. 8, the electronic device 800 may include a data storage unit 810, a memory controller 820, a buffer (cache) memory 830, and an I/O interface 840.

The data storage unit 810 may store data received from the memory controller 820 upon receiving a control signal from the memory controller 820, read the stored data, and output the read data to the memory controller 820. The data storage unit 810 may include various non-volatile memory units having data to remain unchanged when powered off, for example, a Nor Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), etc.

The memory controller 820 may decode a command received from an external device (host device) through an I/O interface 840, and may control data I/O actions of the data storage unit 810 and the buffer memory 830. The memory controller 820 may include the memory controller 620 shown in FIG. 6. Although the memory controller 820 is denoted by one block as shown in FIG. 8 for convenience of description, the memory controller 820 may include a first controller for controlling a non-volatile memory 810 and a second controller for controlling the buffer memory 830 serving as a volatile memory. Here, the first controller and the second controller may be arranged independently from each other.

The buffer memory 830 may temporarily store data to be processed by the memory controller 820. In other words, the buffer memory 830 may temporarily store data to be input/output to/from the data storage unit 810. The buffer memory 830 may store data received from the memory controller 830 upon receiving a control signal from the memory controller 820, read the stored data, and output the read data to the memory controller 820. The buffer memory 830 may include a volatile memory, for example, a Dynamic Random Access Memory (DRAM), a Mobile DRAM, a Static Random Access Memory (SRAM), etc.

The I/O interface 840 may provide a physical connection between the memory controller 820 and the external device (host device), such that the I/O interface 840 may control the memory controller 820 to receive data I/O control signals from the external device as well as to exchange data with the external device. The I/O interface 840 may include at least one of various interface protocols, for example, a universal serial bus (USB) protocol, a multimedia card (MMC) protocol, a peripheral component interconnection (PCI) protocol, a PCI-express (PCI-E) protocol, a serial attached SCSI (SAS), a serial ATA (SATA) protocol, a parallel advanced technology cttachment (PATA) protocol, a small computer small interface (SCSI) protocol, an enhanced small disk interface (ESDI) protocol, and an integrated drive electronics (IDE) protocol.

A memory cell of the data storage unit 810 or the buffer memory 830 for use in the electronic device may include a gate. The gate may include a stacked structure of three layers having different work functions in accordance with an embodiment. As a result, a GIDL is reduced and a threshold voltage (Vt) of a transistor is increased.

For example, the gate includes a threshold-voltage increase layer, a resistance-reduction layer, and a leakage prevention layer. The threshold-voltage increase layer is formed as the lowest layer of the gate, and is formed of a specific material so that there is a large difference in work function between a channel region and the threshold-voltage layer, resulting in an increased threshold voltage (Vt) of a transistor. The resistance-reduction layer is formed over the threshold-voltage increase layer, and obtains resistance of the gate. The leakage prevention layer is formed over the resistance-reduction layer so as to vertically overlap with a junction region, and is formed of a specific material so that there is a small difference in work function between the junction region and the leakage prevention layer, resulting in improved GIDL. In an embodiment, the threshold-voltage increase layer may include a $P^+$ polysilicon material. The resistance-reduction layer may include a metal silicide material. The resistance-reduction layer may include a cobalt silicide ($CoSi_2$) material. The leakage prevention layer may include an $N^+$ polysilicon material.

The electronic device 800 shown in FIG. 8 may be used as an auxiliary memory device or an external storage device of the host device. The electronic device 800 may include a Solid State Disc (SSD), a Universal Serial Bus (USB) memory, a Secure Digital (SD), a mini Secure Digital (mSD) card, a micro SD, a high-capacity Secure Digital High Capacity (SDHC), a memory stick card (MSC), a Smart Media (SM) card, a Multi Media Card (MMC), an Embedded MMC (eMMC), a Compact Flash (CF) card, etc.

The above-mentioned three-layer gate is applied to a cell transistor of the buffer memory 830 for use in the electronic device 800, such that the operation current of the memory device can be reduced and the operation characteristics of the memory device can be improved, resulting in improved operation characteristics of the electronic device.

Figure 9:
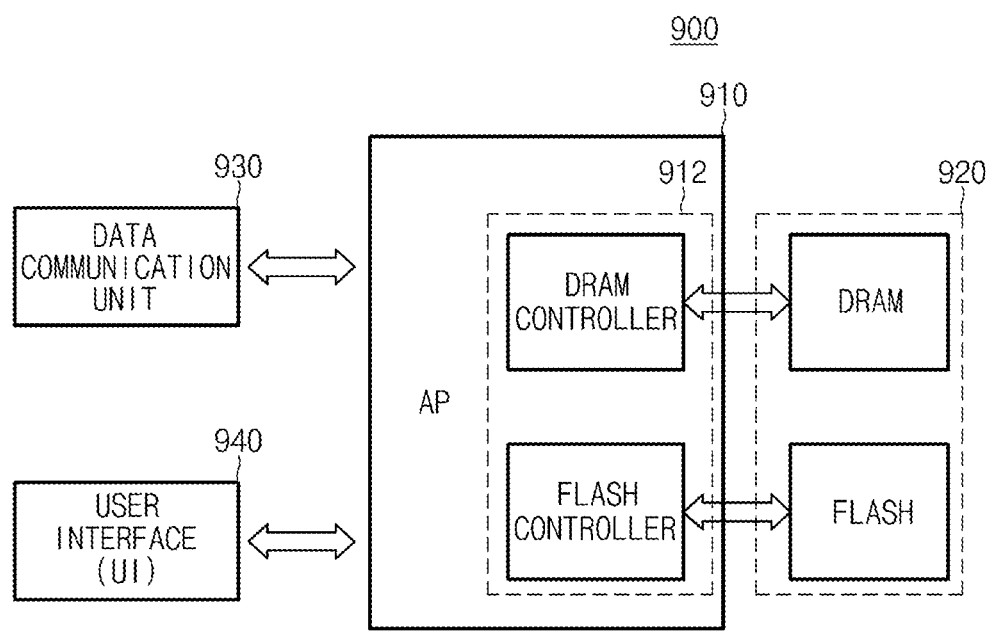
FIG. 9 is a block diagram illustrating an electronic device according to another embodiment.

FIG. 9 is a block diagram illustrating an electronic device according to another embodiment.

Referring to FIG. 9, the electronic device 900 may include an application processor 910, a memory device 920, a data communication unit 930, and a user interface (UI) 940.

The application processor 910 may provide overall control to the electronic device 900, and may be configured to control and adjust a series of operations for processing data in response to an input command received through the user interface (UI) 940 and outputting the processed result. The application processor 910 may be implemented as a multi-core processor so as to perform multi-tasking. Specifically, the application processor 910 may include an SoC-shaped memory controller 912 for controlling data I/O operations of the memory device 920. Here, the memory controller 912 may include not only a first controller for controlling a volatile memory (for example, DRAM) but also a second controller for controlling a non-volatile memory (for example, flash memory). The memory controller 912 may include the memory controller 610 shown in FIG. 6.

Upon receiving a control signal from the memory controller 912, the memory device 920 may store data requisite for operating the electronic device 900, read the stored data, and output the read data to the memory controller 912. The memory device 920 may include a volatile memory and a non-volatile memory. Specifically, the memory device 920 may include a plurality of memory cells for storing data therein. The gate contained in each memory cell may include a stacked structure of three layers having different work functions in accordance with an embodiment. As a result, a GIDL may be reduced and a threshold voltage (Vt) of a transistor may be increased.

For example, the gate includes a threshold-voltage increase layer, a resistance-reduction layer, and a leakage prevention layer. The threshold-voltage increase layer is formed as the lowest layer, and is formed of a specific material so that there is a large difference in work function between a channel region and the threshold-voltage increase layer, resulting in an increased threshold voltage (Vt) of a transistor. The resistance-reduction layer is formed over the threshold-voltage increase layer, and obtains resistance of the gate. The leakage prevention layer is formed over the resistance-reduction layer so as to vertically overlap with a junction region, and is formed of a specific material so that there is a small difference in work function between the junction region and the leakage prevention layer, resulting in improved GIDL. In an embodiment, the threshold-voltage increase layer may include a P+ polysilicon. The resistance-reduction layer may include a metal silicide material. The resistance-reduction layer may include a cobalt silicide ($CoSi_2$) material. The leakage prevention layer may include an N+ polysilicon material.

The data communication unit 930 may be configured to perform data communication between the application processor 910 and the external device according to a predefined communication protocol. The data communication unit 930 may include a module coupled to a wired network and a module coupled to a wireless network. The wired network module may include a Local Area Network (LAN), a Universal Serial Bus (USB), an Ethernet, a Power Line Communication (PLC), etc. The wireless network module may include Infrared Data Association (IrDA), Code Division Multiple Access (CDMA), Time Division Multiple Access (TDMA), Frequency Division Multiple Access (FDMA), Wireless LAN (WLAN), Zigbee, Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), etc.

The user interface (UI) 940 may provide an interface between a user and the portable electronic device 900 so that the user can input data to the portable electronic device 900. The user interface (UI) 940 may include user I/O devices for informing the user of audio or video signals indicating the processed result of the portable electronic device 900. For example, the user interface (UI) 940 may include a button, a keypad, a display (screen), a speaker, etc. incorporated into the electronic device 900.

The above-mentioned electronic device 900 may be implemented as a handheld device, for example, a mobile phone, a smartphone, a tablet computer, a personal digital assistant (PDA), an enterprise digital assistant (EDA), a digital still camera, a digital video camera, a portable multimedia player (PMP), a personal navigation device or a portable navigation device (PND), a handheld game console, or an e-book. In addition, the electronic device 900 may be implemented as an embedded system for performing a specific function of vehicles or ships.

The above-mentioned three-layer gate is applied to a cell transistor of the memory device 920 for use in the electronic device 900, such that the operation current of the memory device can be reduced and the operation characteristics of the memory device can be improved, resulting in improved operation characteristics of the electronic device.

Figure 10:
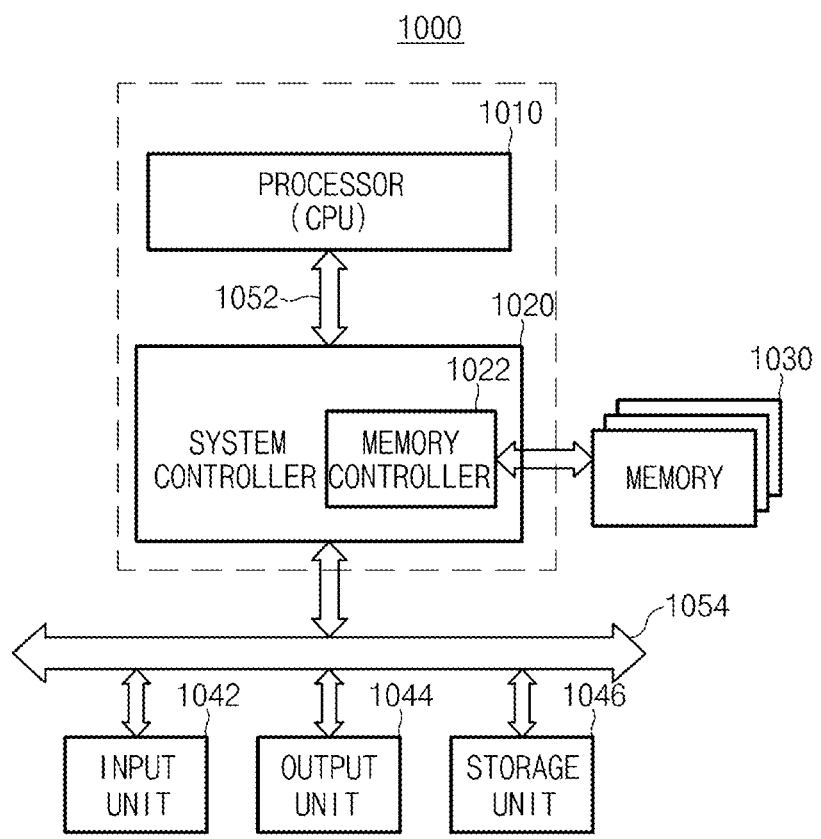
FIG. 10 is a block diagram illustrating an electronic device according to another embodiment.

FIG. 10 is a block diagram illustrating an electronic device according to another embodiment.

Referring to FIG. 10, the electronic device 1000 may include a processor 1010 such as a CPU, a system controller 1020, and a memory device 1030. The electronic device 1000 may further include an input unit 1042, an output unit 1044, a storage unit 1046, a processor bus 1052, and an extended bus 1054.

The processor 1010 may provide overall control to the electronic device 1000, and may be configured to control and adjust a series of operations for processing (or calculating) data (or command) received through the input units 1042 and outputting the processed result to the output unit 1044. The processor 1010 may include a general Central Processing Unit (CPU) or Micro Controller Unit (MCU). The processor 1010 may be coupled to the system controller 1020 through the processor bus 1052 including an address bus, a control bus, and/or a data bus. The system controller 1020 may be coupled to the extended bus 1054 such as a Peripheral Component Interconnection (PCI). Accordingly, the processor 1010 may enable the system controller 1020 to control the input unit 1042 such as a keyboard or mouse, the output unit 1044 such as a printer or display, and the storage unit 1046 such as HDD, SSD, or CDROM. The processor 1010 may be implemented as a multi-core processor.

The system controller 1020 may control data communication between the memory device 1030 and the peripheral devices (1042, 1044, 1046) upon receiving a control signal of the processor 1010. The system controller 1020 may include a memory controller 1022 for controlling data I/O operations of the memory device 1030. In this case, the memory controller 1022 may include the memory controller 610 of FIG. 6. The system controller 1020 may include a Memory Controller Hub (MCH) and I/O Controller Hub (ICU) of Intel Corporation. Although the system controller 1020 and the processor 1010 shown in FIG. 10 are separated from each other for convenience of description, the system controller 1020 may be embedded in the processor 1010 or may be incorporated with the processor 1010 into a single SoC-shaped chip. Alternatively, only the memory controller 1022 of the system controller 1020 may be embedded in the processor 1010, or may be fabricated in the form of an SoC such that the SoC-shaped memory controller 1022 may be contained in the processor 1010.

The memory device 1030 may store data received from the memory controller 1022 upon receiving a control signal from the memory controller 1022, read the stored data, and output the read data to the memory controller 1022. The data storage unit 810 may include the memory device 610 shown in FIG. 6. The gate in each memory cell of the memory device 1030 includes a stacked structure of three layers having different work functions in accordance with an embodiment. As a result, a GIDL is reduced and a threshold voltage (Vt) of a transistor is increased.

For example, the gate includes a threshold-voltage increase layer, a resistance-reduction layer, and a leakage prevention layer. The threshold-voltage increase layer is formed as the lowest layer of the gate, and is formed of a specific material so that there is a large difference in work function between a channel region and the threshold-voltage layer, resulting in an increased threshold voltage (Vt) of a transistor. The resistance-reduction layer is formed over the threshold-voltage increase layer, and obtains resistance of the gate. The leakage prevention layer is formed over the resistance-reduction layer so as to overlap with a junction region, and is formed of a specific material so that there is a small difference in work function between the junction region and the leakage prevention layer, resulting in improved GIDL. In an embodiment, the threshold-voltage increase layer may include a P+ polysilicon material. The resistance-reduction layer may include a metal silicide material. The resistance-reduction layer may include a cobalt silicide ($CoSi_2$) material. The leakage prevention layer may include an N+ polysilicon material.

The storage unit 1046 may store data to be processed by the electronic device 1000. The storage unit may include a data storage unit embedded in the computing system or an external storage unit, and may include the memory system 800 shown in FIG. 8.

The electronic system 1000 may be any one of a variety of electronic systems operated by a variety of processes, for example, a personal computer, a server, a Personal Digital Assistant (PDA), a Portable Computer, a Web Tablet, a Wireless Phone, a mobile phone, a smart phone, a digital music player, a Portable Multimedia Player (PMP), an Enterprise Digital Assistant (EDA), a digital still camera, a digital video camera, a Global Positioning System (GPS), a voice recorder, a Telematics, an Audio Visual (AV) System, a Smart Television, other embedded systems, etc.

The above-mentioned three-layer gate is applied to a cell transistor of the memory device 1030 for use in the electronic device 1000, such that the operation current of the memory device can be reduced and the operation characteristics of the memory device can be improved, resulting in improved operation characteristics of the electronic device.

As is apparent from the above description, a semiconductor device, a method for forming the same, and an electronic device including a semiconductor device according to an embodiment can reduce a GIDL and at the same time can increase a threshold voltage of a transistor.

Those skilled in the art will appreciate that embodiments may be carried out in other specific ways than those set forth herein without departing from the spirit and essential characteristics of the present invention. The above embodiments are therefore to be construed in all aspects as illustrative and not restrictive. Embodiments should be determined by the appended claims and their legal equivalents, not by the above description, and all changes coming within the meaning and equivalency range of the appended claims are intended to be embraced therein. Also, claims that are not explicitly cited in each other in the appended claims may be presented in combination as an embodiment or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device including a multi-layered gate, the semiconductor device comprising:
    a gate insulation film; and
    a gate formed over the gate insulation film,
    wherein the gate includes:
        a threshold-voltage increase layer formed over the gate insulation film, the threshold-voltage increase layer having a first work function;
        a resistance-reduction layer formed over the gate insulation film and having a second work function lower than the first work function; and
        a leakage prevention layer formed over the gate insulation film and having a third work function lower than the second work function.

2. The semiconductor device according to claim 1, further comprising:
    a trench formed in an active region and having a depth,
    wherein the gate is formed at a lower part of the trench so as to be buried in the active region.

3. The semiconductor device according to claim 2, wherein the threshold-voltage increase layer is formed over the gate insulation film, the resistance-reduction layer is formed over the threshold-voltage increase layer, and the leakage prevention layer is formed over the resistance-reduction layer, and
    wherein the gate is formed is provided entirely within the trench.

4. The semiconductor device according to claim 1, wherein the threshold-voltage increase layer includes a $P^+$ polysilicon layer.

5. The semiconductor device according to claim 1, wherein the resistance reduction layer includes a metal silicide layer.

6. The semiconductor device according to claim 1, wherein the leakage prevention layer includes an $N^+$ polysilicon layer.

7. The semiconductor device according to claim 1, wherein the leakage prevention layer vertically overlaps with a storage node junction (SNC) region.

8. The semiconductor device according to claim 1, further comprising:
    active pillars vertically protruding from a semiconductor substrate in an active region,
    wherein the gate is disposed between the active pillars in the active region.

9. The semiconductor device according to claim 8, further comprising:
    a gate contact coupled to the gate; and
    a word line coupled to the gate contact.

10. A semiconductor device including a multi-layered gate, the semiconductor device comprising:
    a gate insulation film; and
    a gate formed over the gate insulation film,
    wherein the gate includes:
        a $P^+$ polysilicon layer formed over the gate insulation film;
        a cobalt silicide ($CoSi_2$) layer formed over the $P^+$ polysilicon layer and the gate insulation film; and
        an $N^+$ polysilicon layer formed over the cobalt silicide ($CoSi_2$) layer and the gate insulation film.

11. The semiconductor device according to claim 10, further comprising:
    a trench formed in the active region and having a depth,
    wherein the gate is formed in a lower part of the trench so as to be buried in the active region.

12. The semiconductor device according to claim 10, wherein the $N^+$ polysilicon layer vertically overlaps with a storage node junction (SNC) region.

13. The semiconductor device according to claim 10, further comprising:
    active pillars vertically protruding from a semiconductor substrate in an active region,
    wherein the gate is disposed between the active pillars in the active region.

14. An electronic device comprising:
    a memory device configured to store data and read the stored data in response to a data input/output (I/O) control signal; and
    a memory controller configured to generate the data I/O control signal, and control data I/O operations of the memory device,
    wherein the memory device includes:
        a gate insulation film; and
        a gate formed over the gate insulation film,
        wherein the gate includes:
            a threshold-voltage increase layer formed over the gate insulation film and having a first work function;
            a resistance-reduction layer formed over the gate insulation film and having a second work function lower than the first work function; and a leakage prevention layer formed over the gate insulation film and having a third work function lower than the second work function.

15. The electronic device according to claim 14, further comprising:
a processor configured to store data in the memory device by controlling the memory controller, and to perform a calculation corresponding to an external input command using data stored in the memory device.

16. The electronic device according to claim 15, wherein the memory controller and the processor are fabricated in a System on Chip (SoC) shape.

* * * * *